(12) United States Patent
Douglas et al.

(10) Patent No.: US 8,040,058 B2
(45) Date of Patent: Oct. 18, 2011

(54) INKJET PRINTING OF MICROLENSES FOR PHOTONIC APPLICATIONS

(75) Inventors: Elliot P. Douglas, Gainesville, FL (US); Jiangeng Xue, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 30 days.

(21) Appl. No.: 12/664,909

(22) PCT Filed: Jun. 18, 2008

(86) PCT No.: PCT/US2008/067342
§ 371 (c)(1),
(2), (4) Date: Dec. 16, 2009

(87) PCT Pub. No.: WO2008/157604
PCT Pub. Date: Dec. 24, 2008

(65) Prior Publication Data
US 2010/0181901 A1   Jul. 22, 2010

Related U.S. Application Data

(60) Provisional application No. 60/944,631, filed on Jun. 18, 2007.

(51) Int. Cl.
*H01J 1/62* (2006.01)
*H01J 63/04* (2006.01)
*B05D 5/12* (2006.01)

(52) U.S. Cl. ........ 313/506; 313/483; 313/500; 313/501; 313/504; 313/505; 427/162; 427/64

(58) Field of Classification Search ........................ None
See application file for complete search history.

(56) References Cited

U.S. PATENT DOCUMENTS

| | | | |
|---|---|---|---|
| 5,235,463 A | 8/1993 | Broussoux et al. | |
| 5,498,444 A | 3/1996 | Hayes | |
| 6,805,902 B1 | 10/2004 | Hayes | |
| 7,205,714 B2 | 4/2007 | Chen | |
| 2002/0196563 A1 | 12/2002 | Itoh | |
| 2010/0201256 A1* | 8/2010 | Xue et al. | 313/504 |

OTHER PUBLICATIONS

Huang, W., et al., "Fabrication of a microlens array using ink-jet printing on a pre-patterned substrate by self-assembled monolayers," *Poster Presentation at Preferred Micro- and Nano-Engineering 2006 Session: Nanoscale Engineering & Fabrication.*

* cited by examiner

*Primary Examiner* — Natalie Walford
(74) *Attorney, Agent, or Firm* — Saliwanchik, Lloyd & Eisenschenk

(57) ABSTRACT

The preparation of microlenses on a substrate and light emitting devices employing microlenses on the surface from which light is emitted is described. The miscrolenses are formed on a surface that has been coated to have functionality that promotes a sufficiently large contact angle of the microlense on the surface and contains functionality for bonding the microlense to the coating. The microlenses are formed on the coating by deposition of a microlense precursor resin as a microdrop by inkjet printing and copolymerizing the resin with the bonding functionality in the coating. The coating can be formed from a mixture of silane coupling agents that contain functionality in some of the coupling agents that is copolymeriable with the resin such that the microlens can be formed and bonded to the surface by photopolymerization.

22 Claims, 3 Drawing Sheets (a)

(b)

(a)

(b)

INKJET PRINTING OF MICROLENSES FOR PHOTONIC APPLICATIONS

CROSS-REFERENCE TO RELATED APPLICATIONS

The present application is the U.S. National Stage Application of International Patent Application No. PCT/US2008/067342, filed on Jun. 18, 2008, which claims the benefit of U.S. Provisional Application Ser. No. 60/944,631, filed Jun. 18, 2007, both of which are hereby incorporated by reference herein in their entirety, including any figures, tables, or drawings.

FIELD OF THE INVENTION

The invention is directed to the formation of microlenses by the deposition of microdrops of photopolymerizable materials via inkjet printing and subsequent photopolymerization of the material to the microlenses.

BACKGROUND OF THE INVENTION

As the number of applications for electro-optical systems increases, the role of microlens arrays (MLAs) to allow adequate performance to cost is crucial and an effective method to mass produce MLAs need to be developed. Several methods that have been used to fabricate MLAs include; thermal reflow and etching transfer; hot embossing; and laser ablation. However, there remain drawbacks to the use of these methods including the fabrication cost. For example, the thermal reflow and etching transfer method uses a complicated lithographic procedure that further suffers from the generation of environmentally unfriendly wastes. The hot-embossing method remains impractical because of shrinkage and thermal damage problems. Laser ablation methods remain impractical for most mass production due to high fabrication costs. Another common method is to create a master mold by methods such as machining and electroplating, followed by filling the mold with a monomer or oligomer, polymerizing the monomer or oligomer, and attaching the resulting MLA to the desired device. This method requires multiple steps for MLA fabrication and attachment and, thus, the fabrication costs are higher than they would be for a single step method.

One area where the use of a MLA can significantly lower the cost of a technology is the deposition of such an array on a light emitting diode (LED) including an organic light emitting diode (OLED). In general, OLEDs consist of a multi-layer sandwich of a transparent electrode, such as indium-tin-oxide (ITO), as anode contact, one or more organic layers including a light emitting molecule or polymer layer, and a metal layer as cathode, deposited on a planar substrate, usually of glass or a high refractive index plastic such as polycarbonate. In "bottom emission" devices, the transparent electrode, usually the anode, is deposited on the front surface of a transparent substrate followed by a multilayer sandwich, with the reflecting electrode layer, usually the cathode, furthest away from the substrate. Light generated internally in the light emitting layer is transmitted out of the device through the transparent electrode and the substrate. Conversely, in a "top emission" device, the reflective electrode is in contact with the substrate while the transparent electrode is furthest away from the substrate. The light generated internally in the light emitting layer is then coupled externally through the transparent electrode layer without passing through the substrate. Usually the transparent electrode layer is the cathode which can be made substantially transparent by using a transparent conducting material or a thin metal layer having a thickness less than around 50-100 nm. In bottom emission devices, typically only about 20% of generated light is emitted through the substrate-air interface with the remainder being trapped and absorbed within the substrate, e.g. 35%, and the light emitting multi-layer sandwich and the transparent electrode, e.g. 45%.

This low light emitting efficiency arises primarily because light is wave-guided, scattered and reflected internally at the layer interfaces due to the different refractive indices exhibited by the different materials foiining the layers of the device. Efforts have been directed to improve the coupling efficiency, by affording the back side of the substrate with a non-planar profile, or by attaching microlenses, in order to extract more light from the substrate. For example, Sturm et al. WO 01/33598 discloses patterning the back side of the substrate in the shape of a sphere centered on the multi-layer light source by attaching a molded sphere to the back surface of the substrate or by shaping the back surface of the substrate into a spherical form. Thus, some of the generated light that would otherwise be reflected internally at the substrate-air interface escapes the substrate, thereby increasing the amount of light emitted from the device.

According to WO 01/33598, the total emitted light can be increased by a factor of up to 3, and the normal emitted light can be increased by a factor of nearly 10, through the use of spherical lenses of various radii of curvature on glass or polycarbonate substrates of various thicknesses. The disclosed lenses have a radius of curvature (R) to substrate thickness (T) ratio (R/T) in the range from 1.4 to 4.9. Similarly, Kawakami et al. JP-A-9171892 discloses that light emission from the substrate can be increased by including a spherical lenses shape on the emitting face of the substrate in which the radius of curvature (R) to substrate thickness (T) ratio (R/T) is about 3.6. Smith et al. WO 05/086252 discloses improvements in light emission from an OLED device by forming or attaching spherical microlenses to the substrate, at the substrate-air interface, such that the radius of curvature (R) to substrate thickness (T) ratio (R/T) is in the range from 0.2 to 0.8. Each microlens is disposed on the front surface of the light coupling layer where the microlens extends across the full width of each pixel. Smith et al. disclose that the lenses may be applied to or formed in the light coupling layer, by adhering the lenses to the light coupling layer, by directly embossing the light coupling layer or substrate to form the appropriately shaped lenses, or by adhering an embossed laminate having the lenses formed therein to the light coupling layer.

A cost effective method for placing microlenses on a LED or OLED would encourage a wider use of this technology for devices that include flat-panel displays and solid-state lighting because of the improved light emitting efficiency possible due to the microlenses. One method of forming a microlens on a substrate that has been investigated is via ink-jet printing.

Inkjet printing is based on the phenomena that a fluid under pressure issues from an orifice, typically 50 to 80 μm in diameter, and breaks up into uniform drops when a capillary wave is induced onto the jet, usually by an electromechanical device that causes pressure oscillations to propagate through the fluid. The drops break off from the jet in the presence of an electrostatic field, referred to as the charging field, which imparts an electrostatic charge to the drops. The charged drops are directed to their desired location, either a catcher or one of several locations on a substrate, by another electrostatic field, referred to as a deflection field. This type of system is generally referred to as "continuous" because drops are continuously produced and their trajectories are varied by the amount of charge applied. Continuous mode ink-jet printing systems produce droplets that are approximately twice the orifice diameter of the droplet generator.

The drops can also be produced by electro-induced pressure waves in a fluid under ambient pressure where a volumetric change in the fluid is induced by the application of a voltage pulse to a piezoelectric transducer, which is directly or indirectly coupled to the fluid. This volumetric change causes pressure/velocity transients to occur in the fluid and these are directed to produce a drop that issues from an orifice. Since the voltage is applied only when a drop is desired, these types of systems are referred to as "drop-on-demand" (DOD). A thin film resistor can be substituted for the piezoelectric drive transducer where the fluid in contact with the resistor is vaporized to form a vapor bubble over the resistor upon passing a high current through the resistor. This vapor bubble serves the same functional purpose as the piezoelectric transducer. Demand mode ink-jet printing systems produce droplets that are approximately equal to the orifice diameter of the droplet generator.

Ink-jet printing allows a precise microdispensing of a fluid in a repeatable manner. The droplets generated by current DOD device may be varied in diameter from about 15 µm to about 120 µm by changing the dispensing device orifice diameter and/or the drive waveform at rates up to about 25,000 drops per second. Piezoelectric demand mode does not create thermal stress on the fluid and does not depend on the thermal properties of the fluid to impart acoustic energy to the working fluid which enables the dispensing of fluids ranging from polymer formulations to liquid solders. Appropriate viscosities of many fluid formulations can be optimized by a controlled heating of the fluid to a desired temperature. Ink-jet printing has become a key enabling technology in the development of bio-MEMS devices, displays, sensors, electrical components, and micro-optical systems. More recently ink-jet printing has been explored for use for opto-electronic packaging. It has been explored for printing microlenses for optical interconnects including optical fiber collimators, solders for electrical interconnects, and adhesives for bonding and sealing.

Inkjet printing has been used to form microlenses on substrates. Microlenses have been formed by the deposition of a drop of a polymer in solution where the microlens is formed upon the removal of the solvent. Additionally, microlenses have been formed by the deposition of drops of monomers or polymers with functionality that can be polymerized on a substrate by thermal or photochemical means, for example as disclosed in Hayes, U.S. Pat. No. 6,805,902. Such systems require that the resulting microlens is well attached to the substrate. For LED and OLED applications, it is desirable that a microlens have a large contact angle with a substrate to optimize the proportion of light transmitted from the device. The typical substrate droplet interface displays a contact angle that is considerably less than 90 degrees.

To promote a large contact angle the surface of the substrate has been patterned with a coating as disclosed in Huang et al, Poster Presentation P-MST53 at MNE'06, http://dimesnet.dimes.tudelft.nl/mneabstracts/P-MST/P-MST53.pdf. The substrate is unmodified on the area for deposition of the microlens but coated with a low surface energy material such that the deposited material resists spreading over the coated portion of the substrate, enhancing the contact angle between the coated substrate and the microlens material but does not compromise the more a robust attachment of the microlens to the uncoated substrate.

The modification of the surface by deposition of a patterned coating significantly complicates the process, as the drop must be specifically directed to the uncoated portions of the surface. The requirement of such specific drop positioning requires a precision that significantly increases the cost of the microlens formation process. Hence, a simple cost effective method to form a microlens with a high contact angle between the microlens and the substrate that can be easily integrated with existing OLED processes remains a goal for the development of OLED devices.

SUMMARY OF THE INVENTION

The invention is directed to the formation of a light emitting device that has a light emitting layer between a cathode layer and an anode layer where at least one of the electrode layers is transparent and has a surface through which light is emitted that is coated with one or more microlens attached to the coating. The contact angle between the microlenses and the coating are in excess of 40 degrees, for example, the contact angle can be 60 to about 90 degrees. In one embodiment of the device, the coating can be the condensation residue of silane coupling agents where some of the coupling agents promote the desired contact angle and some of the coupling agents contain functionality that bonds with the microlens material. In another embodiment, the coating can be a siloxane polymer or copolymer that has functionality to bond to the surface, functionality that promotes the desired contact angle, and functionality that bonds to the microlenses. The coating is preferably less than about 100 nm in thickness. The microlenses can be about 2 µm in diameter to about 500 µm in diameter.

Another embodiment of the invention is directed to a method to form microlenses on a surface. A solid surface is coated with a coating material that includes at least one component for inducing a large contact angle with a resin and at least another component for copolymerizing with a resin. The resin is deposited on the coating as one or more microdrops, which is cured to form microlenses that are covalently bonded to the coating material by copolymerization between functionality in the resin and copolymerizable components in the coating. The surface can be a substrate of a LED or an OLED where transmitted light escapes the diode. The coating step can be carried out by dipping, spraying, rolling, brushing, vapor deposition, or spin coating with a coupling agent mixture that can include but does not require a solvent. The microdrops can be deposited on the coating by inkjet printing. The resin can contain a photoinitiator. The photoinitiation of copolymerization can occur upon irradiation from a lamp external to an article having said surface. Alternately, where a light emitting device is the surface, the light emitted from the device can initiate the copolymerization to the coating bound microlenses.

In one embodiment of the method, the coating step can be covering the surface with a mixture of one or more first silane coupling agents, which has a structure for bonding to the surface and a structure that induces a large contact angle at the interface between the coating and the resin, and one or more second silane coupling agents, which have a structure for bonding to the surface and a structure that can copolymerize with the resin. The second silane coupling agent can be about 0.1 to about 25 weight percent of the mixture of coupling agents.

In another embodiment of the method, the coating step can be the deposition of a siloxane polymer where the siloxane polymer has repeating units that bond to the surface, other repeating units that have the components for inducing a large contact angle, and other repeating units that have the components for copolymerization with the resin. For example, the siloxane polymer can be a siloxane terpolymer.

In one embodiment of the method, the resin that forms the microlenses can be a radically polymerizable resin that contains a radical photoinitiator with which the second component in the coating radically copolymerizes. The polymerizable second component can have equal or greater reactivity with the growing radical than the polymerizable groups of the resin. For example, the radically polymerizable resin can be an acrylate or methacrylate functionalized monomeric, oligomeric, or polymeric molecules. Additionally, the resin can include a photosensitizer, a chain termination agent, and/or a chain transfer agent.

In another embodiment of the method, the resin that forms the microlenses can be a photoactivated addition step-growth polymerization with which the second component in the coating copolymerizes. A thiol-ene addition reaction can be carried out under irradiation of a resin that is a mixture of di-, tri- and/or polymercaptans with di-, tri- and/or vinyl ethers to yield a microlens. The mixture can have an equal amount of thiol and vinyl groups, or can have an excess of a tri- or polyvinyl or thiol monomer.

In another embodiment of the method, the resin can be a cationically polymerizable resin containing a cationic photoinitiator where the second component of the coating cationically copolymerizes with the resin. The second component can have equal or greater reactivity with the growing cationic intermediate than does the polymerizable groups in the resin.

By repeating the steps of depositing and curing, microlens arrays can be formed and the microlenses can be in contact with, or touch, each other. The arrays can have any pattern including parallel rows and columns, hexagonal close packed structures, and, when microdrops of different sizes are deposited, arrays of large microlenses that have small microlenses disposed between the large microlenses.

DETAILED DESCRIPTION

Figure 1:
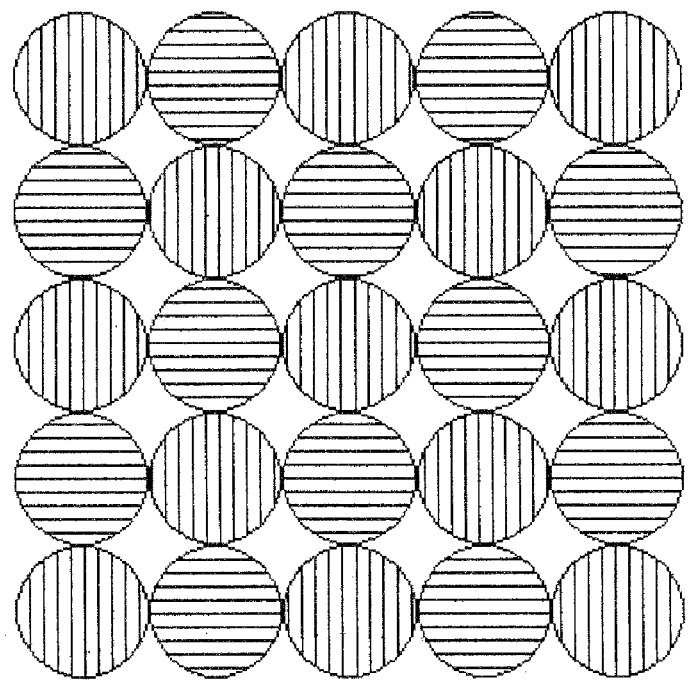
FIG. 1 shows regular periodic patterns of same sized microlenses that have touching edges where in (a) two deposition passes are indicated by different hashing to give an array of parallel rows and columns and (b) three deposition passes are indicated by different hashing to give a hexagonal closest packed array.
Figure 1:
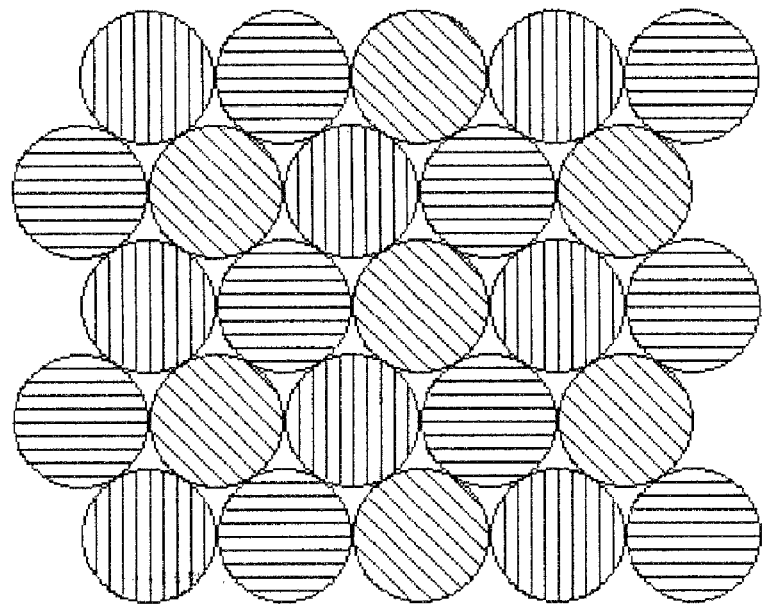

In one embodiment, the invention involves a method for the formation of a microlens or a microlens array on a surface in a manner where the only patterning step during the formation of the microlenses is the deposition of the microlens material. The surface can be a substrate or the surface of a structure or device on a substrate. By the method of the invention, a well adhered microlens can be formed on a substrate with a contact angle that is about 40 degrees to about 90 degrees. No patterned coating is required to achieve the high contact angle.

The method involves the deposition of a photopolymerizable microlens precursor on the surface via inkjet printing. The method is enabled by the deposition of a coating that provides functionality for the adherence of the coating to the substrate, provides structure that enhances the contact angle between the deposited microlens precursor, and functionality for bonding of the microlens to the coating upon curing. The microlenses are essentially transparent to the wavelengths of light that are to be transmitted from a device upon which the microlenses are disposed. For the purposes of the invention, the light can be infrared, visible or ultraviolet radiation.

A LED or OLED device can be fabricated by any technique such that a light generating region resides between a cathode layer and an anode layer on a substrate. Where one of the electrodes, either the cathode or the anode, is essentially transparent such that an adequate amount of light generated is transmitted through the electrode. The electrode can transmit less than 100 percent of the light generated. The substrate can then be coated with a material that uniformly covers and adheres to the substrate surface. The coating can adhere by any physical or chemical interaction. In one embodiment of the invention the coating is formed from a material that can covalently bond with the substrate surface. In a preferred embodiment, the substrate is an oxide or a polymer containing silanol or other hydroxy functionality at the surface and the coating results from an essentially uniform deposition of silane coupling agents on the substrate surface.

The coupling agents display a functionality that will react with the hydroxyl functionalities on the surface and to each other upon the addition of water. A portion of the coupling agents also contains a structure that is essentially immiscible with the microlens precursor to be applied as droplets on the coated substrate of the OLED. The nature of the interaction between the microlens precursor and the coating on the substrate causes the microdrop to have a high contact angle, of about 40 degrees to about 90 degrees or greater, between the coating surface and the microlens precursor. The coupling agent can include alkyltrialkoxysilanes, alkyltrichlorosilanes, alkyltrihydrosilanes, alkyltrialkylaminosilanes, alkyltri(dialkylamino)silanes, a-trialkoxysilyloligodimethylsiloxanes, a-trichlorosilyloligodimethylsiloxanes, a-trihydrosilyloligodimethylsiloxanes, a-trialkylaminosilyloligodimethylsiloxanes a-tri(dimethylamino)silyloligodimethylsiloxanes, α,ω-bis(trialkoxysilyl)oligodimethylsiloxanes, α,ω-bis(-trichlorosilyl)oligodimethylsiloxanes, α,ω-bis(-trihydro silyl)oligodimethylsiloxanes, α,ω-bis(-trialkylaminosilyl)oligodimethylsiloxanes α,ω-bis(-tri (dimethylaminosilyl)oligodimethylsiloxanes, fluorinated variations thereof, and mixtures thereof. The alkyl group of these coupling agents can be 1 to 20 carbon atoms and can be straight chained or branched. Oligomers can be dimers through decamers or greater. The oligomers can have monodispersed or polydispersed size distributions. Although coupling agents with three reactive groups on the silicon atom to be attached to the surface are preferred, some or all of the coupling agent mixture can have only one or two reactive groups on the silicon atom. It is to be understood that any of the exemplary coupling agents described below can have less than three reactive groups, even though a trifunctional silicon atom is recited.

Depending upon the nature of the microlens precursor, additional or alternate functionality is included into some of the coupling agents. For example, where the microlens precursor is polymerized and/or cross-linked via vinyl addition reactions between acrylate or methacrylate groups, acrylate or methacrylate functionality can be incorporated into some of the coupling agents. The coupling agent of this example has acrylate or methacrylate functionality that undergoes vinyl addition with the acrylate or methacrylate groups of the microlens precursor resin after its deposition and the initiation of the vinyl addition reaction. Preferably, initiation occurs upon irradiation with light to generate reactive species from a photoinitiator that is present in the microlens precursor resin. The functionality that undergoes vinyl addition with the microlens precursor can be one known to yield alternating copolymers with the vinyl functionality of the microlens precursor. As is understood by those skilled in the art, the vinyl addition can be to a disubstituted alkene or conjugated diene functionality in either the microlens precursor or the coupling agent residue of the coating.

For example when the microlens precursor contains acrylate groups, a portion of the coupling agent can be an w-acryloxyalkylltrialkoxysilane when the remaining coupling agent is one of the coupling agents with at least one trialkoxysilane group from the list above. In general, although not necessarily, the various coupling agents for reaction with the substrate surface have the same surface bonding functionality for all coupling agents such that the proportions of silane coupling agents attached to the surface are approximately the same as the proportion of the mixture of coupling agents applied to the surface, as the rates of reactions between the substrate surface and the coupling agents can be nearly identical. When the functionalities are different, the proportion of coupling agents attached to the substrate surface are generally different from their proportions in the coupling agent mixture applied to the substrate and the proper mixture to achieve a desired proportion of coupling agents attached to the substrate can be determined by experimentation or by calculations if the appropriate reaction parameters are known or determined.

It is preferable, although not necessary, that the microlens bonding coupling agent is deposited on the substrate such that it is randomly attached over the entire substrate and is not aggregated into islands of high population of residues from the resin bonding coupling agent. It is preferable that the resin bonding coupling agent is deposited with the high contact angle enhancing coupling agent where the partitioning of the different coupling agents to the surface does not concentrate the contact angle enhancing coupling agent at the surface and exclude the resin bonding coupling agent. When partitioning would exclude the resin bonding coupling agent from the substrate surface, the resin bonding coupling agent can be deposited on the substrate from a solution where a controlled concentration and quantity of the solution is applied to ensure that the resin bonding coupling agent only binds to the desired amount of about 0.1 percent to about 25 percent of the surface. The contact angle enhancing coupling agent can then be applied to saturate the remaining surface binding sites. Any and all coupling agents can be deposited from solution as well as from a solvent free mixture. Excess coupling agents and solvents can be removed from the coating by evaporation or washing with the same or a different solvent followed by evaporation of the solvent used for washing. In general, any solvent used is inert toward the coupling agents.

In general, the proportion of coupling agents for bonding of the microlens attached to the substrate surface will be small relative to the proportion of coupling agents that provide the structure to achieve a high contact angle with the microlens precursor. As the coupling agent with functionality for bonding with the microlens by nature has a higher miscibility with the microlens precursor, high levels of this coupling agent can be deleterious to the achievement of the desired high contact angles. The inclusion of the microlens bonding coupling agents is less than about 25 percent, preferably less than 10 percent and most preferably less than 5 percent although generally in excess of 0.1 percent.

The coating is carried out in a manner where the entire surface is contacted with the coating material. No patterning is required as the small amount of coating functionality that can bond with the microlens precursor at the coating microlens interface is sufficient to adhere the microlens to the coated substrate surface. The coating layer should be thin, generally less than about 100 nm in thickness and preferably less than about 50 nm in thickness. The preferred coating layer is the monomolecular layer of coupling agents attached to the substrate for this embodiment of the invention.

Alternative coatings that can be used in embodiments of the invention are silicone copolymers which contain functionality for binding to a substrate surface, functionality for bonding with the microlens, and structure to achieve a high contact angle with the microlens precursor. The multiple dimethylsiloxy repeating units of the copolymer promote the high contact angle. Other functionality that can be incorporated to siloxy repeating units to promote a high contact angle include fluorinated organic groups such as 1H,1H,2H,2H-perfluoroalkyl groups, pentafluorophenyl groups and oligomers of hexafluoropropeneoxide with appropriate structure to attach these functionalities to siloxy repeating units. The coating can also be an organic copolymer that contains functionality for binding to a substrate surface, functionality for bonding with the microlens, and structure to achieve a high contact angle with the microlens precursor. The substituents for promoting the high contact angle can be siloxane units or fluorinated organics. The deposition of such polymers can be from the liquid polymer, from solution, or from a vapor deposition. A liquid deposition can involve dipping, spraying, painting, spin coating or any other technique practiced in the art. When a solution is used to deposit such a coating, a step of removing the solvent is generally required and any common technique used in the art can be employed. Vapor deposition has advantages where the substrate may be sensitive to large amounts of liquids or a solvent.

For one embodiment of the invention, many different photo-polymerizable resins can be used as the microlens precursor in the practice of the invention. Resins are preferably delivered using an inkjet print head. Any device capable of delivering microdrops 500 μm or smaller in diameter can be used rather than an inkjet print head. Other means that can deliver the microdrops to the coated substrate surface can be used. The resin has an appropriate viscosity to be delivered in this form. Although a solvent can be included in the resin, it is preferable that no solvent is included in the resin. When a solvent is included, it is preferable if it does not diminish the contact angle displayed between the resin and the coating and it is more preferred that when a solvent is used, it enhances the contact angle displayed between the coating and the resin. The resin can be heated to reduce its viscosity as needed within the temperature limitations of the print head, the coating, and the substrate to which the coating is applied. In general the resin is applied at a temperature of about 0 to about 200° C., and preferably at temperatures of about 20 to about 100° C. Polymerization methods include those where radical, ionic, metathesis or concerted mechanisms can be involved. Resins can be cured thermally. Preferably, resins can be cured via any photo-polymerization mechanism. Among preferred resins are acrylate resins. When an acrylate resin is used, a component of the coating, for example at least one of the plurality of coupling agents employed, should contain an acrylate or a functionality that readily copolymerizes with acrylates. Preferred resins display a refractive index in excess of 1.4 and more preferably above 1.5 and most preferably above 1.7.

Examples of UV-curable acrylic resins that can be employed in an embodiment of the invention include prepolymers, oligomers, monomers, and photopolymerization initiators. Prepolymers or oligomers include: acrylates such as epoxy acrylates, urethane acrylates, polyester acrylates, polyether acrylates, and spiroacetal acrylates; and methacrylates such as epoxy methacrylates, urethane methacrylates, polyester methacrylates, polyether methacrylates, and polysiloxane methacrylates. Monomers include: monofunctional monomers such as 2-ethylhexyl acrylate, 2-ethylhexyl methacrylate, 2-hydroxyethyl acrylate, 2-hydroxyethyl methacrylate, N-vinyl-2-pyrrolidone, carbitol acrylate, tetrahydrofurfuryl acrylate, isobornyl acrylate, dicyclopentenyl acrylate, and 1,3-butanediol acrylate; bifunctional monomers such as 1,6-hexanediol diacrylate, 1,6-hexanediol dimethacrylate, neopentyl glycol diacrylate, neopentyl glycol dimethacrylate, ethylene glycol diacrylate, polyethylene glycol diacrylate, and pentaerythritol diacrylate; and polyfunctional monomers such as trimethylolpropane triacrylate, trimethylolpropane trimethacrylate, pentaerythritol triacrylate, and dipentaerythritol hexaacrylate. Halogenated versions of the above monomers, such as pentabromophenylmethacrylate and pentabromophenylacrylate are preferably used in some embodiments of the invention as they yield upon polymerization a material having a high refractive index, for example, of approximately 1.7. Other radically polymerizable monomers or oligomers can be used, for example, styrenic monomers or other aromatic group containing monomers which inherently have high refractive indexes.

Examples of photopolymerization initiators, radical-generating compounds, include: acetophenones such as 2,2-dimethoxy-2-phenylacetophenone; butylphenones such as a-hydroxyisobutylphenone and p-isopropyl-α-hydroxyisobutylphenone; acetophenone halides such as p-tert-butyl-dichloroacetophenone, p-tert-butyltrichloroacetophenone and a,a-dichloro-4-phenoxyacetophenone; benzophenones such as benzophenone and N,N-tetraethyl-4,4-diaminobenzophenone; benzyls such as benzyl and benzyl dimethyl ketal; benzoins such as benzoin and benzoin alkyl ether; oximes such as 1-phenyl-1,2-propanedione-2-(o-ethoxycarbonyl)oxime; xanthones such as 2-methylthioxanthone, and 2-chlorothioxanthone; and Michler's ketone. Compounds, such as amines, may be added to prevent oxygen from inhibiting curing. The curing may be carried out in the presence of an inert atmosphere to an oxygen free resin. A sensitizer that absorbs photons and transfers the energy to the initiator can be included in the system to permit initiation to occur at a wavelength that does not directly excite the initiator. Any photosensitizer known to those skilled in the art can be used for the practice of the invention. In general photoinitiators and, if present, photosensitizers are less than 10 percent by weight of the resin and preferably are less than 5 percent of the resin, and most preferable are 1 percent or less of the resin. Generally catalyst levels are in excess of 0.005 percent by weight.

In an embodiment of the invention, the resin can also contain a terminating or chain transfer agent. The terminating or chain transfer agent can be monofunctional, but is preferably di-, tri-, or polyfunctional and can provide cross-linking sites to a cured microlens. Among agents that can be included mercaptans are ethylene glycol dimercaptopropionate, diethylene glycol dimercaptopropionate, 4-t-butyl-1,2-benzenedithiol, bis-(2-mercaptoethyl)sulfide, 4,4'-thiodibenzenethiol, benzenedithiol, glycol dimercaptoacetate, glycol dimercaptopropionate, ethylene bis-(3-mercaptopropionate), polyethylene glycol dimercaptoacetates, polyethylene glycol di-(3-mercaptopropionates),2,2-bis-(mercaptomethyl)-1,3-propanedithiol, 2,5-dimercaptomethyl-1,4-dithiane, bis-phenofluorene bis-(ethoxy-3-mercaptopropionate), 4,8-bis-(mercaptomethyl)-3,6,9-trithia-1,11-undecanedithiol, 2-mercaptomethyl-2-methyl-1,3-propanedithiol, 1,8-dimercapto-3,6-dioxaoctane, thioglycerol bis-mercaptoacetate, trimethylol propane (tris-mercaptopropionate), trimethylolpropane tris-(3-mercaptopropionate), trimethylolpropane tris-(3-mercaptoacetate), tris-(3-mercaptopropyl) isocyanurate, 1,2,3-trimercaptopropane, dipentaerythrithiol, 1,2,4-trimercaptomethyl benzene, or tris-(3-mercaptopropionate) triethyl-1,3,5-triazine-2,4,6-(1H,3H,5H)-trione.

Mercaptan agents can also undergo addition to an alkene functionality by a thiol-ene reaction which can be initiated photochemically without any added initiator. Hence, in an another embodiment of the invention, the resin can be a combination of a di-, tri- or polymercaptan with a di-, tri-, or polyene which can be cured by a step-growth in addition to or rather than the chain growth processes described above. In an embodiment where an initiator free photopolymerization via a thiol-ene reaction, a mercaptan, as indicated above, can be combined with a vinyl ether, for example, butanediol divinyl ether, pentanediol divinyl ether, hexanediol divinyl ether, heptanediol divinyl ether, cyclohexane dimethanol divinyl ether, ethylene glycol divinyl ether, diethylene glycol divinyl ether, triethylene glycol divinyl ether, neopentyl glycol divinyl ether, ethoxylated$_{2-20}$ bisphenol A divinyl ether, poly-THF divinyl ether, bis-(4-ethenyloxybutyl)-succinate, bis-((4-((ethenyloxy)methyl)cyclohexyl)methyl)succinate, bis-(4-ethenyloxybutyl)adipate, bis-((4-((ethenyloxy)methyl)cyclohexyl)methyl)adipate, bis-(4-ethenyloxybutyl)glutarate, and bis-((4-((ethenyloxy)methyl)cyclohexyl)methyl)glutarate. The stoichiometry of the ene to thiol groups can be unity or an excess of one or the other group, where the excess group is preferably on a tri- or polyfunctional monomer.

In another embodiment of the invention, polymerization of the microlens precursor can be carried out by the photocationic polymerizable resin which include at least one alkenylether, oxetane, epoxy and/or episulfide containing prepolymers, oligomers and monomers with an appropriate initiator, such as a diaryliodonium or triarylsulfonium salt. Photo-cationic polymerization systems have the advantage that the polymerization can be carried out in an environment that includes oxygen without the oxygen inhibition common to radical systems. Polymerizations are generally very rapid. In this embodiment the coating, for example a coupling agent, should contain at least one alkenyl ether, oxetane, epoxy and/or episulfide functionality for copolymerization with the photo-cationic polymerizable resin such that the functionality of the coupling agent should match the functionality of the resin.

Examples of photo-cationic polymerizable pre-polymers, oligomers and monomers that can be used in an embodiment of the invention include epoxys such as phenyl glycidyl ether, ethylene glycol diglycidyl ether, glycerin diglycidyl ether, vinyl cyclohexenedioxide, 1,2,8,9-diepoxylimonene, 3,4-epoxycyclohexylmethyl-3',4'-epoxycyclohexane carboxylate, bis(3,4-epoxycyclohexyl)adipate, and monomers, oligomers, and polymers that display at least one epoxy unit in the structure. In similar fashion the monomers, oligomers, or polymers can display alkylene ether, oxetane, or episulfide functional groups. Again the preferred resin displays a refractive index of more than 1.4, more preferably above 1.5 and most preferably above 1.7.

Photo-cationic initiators include diaryliodonium and triarylsulfonium salts. The aryl groups can be substituted in any position. In general the substituents enhance the solubility of the salt in the resin. For example, a siloxane miscible salt can contain one or more siloxane substituents. The anion of the salt is generally the conjugate base of a "super acid". For example the anion can be $PF_6^-$, $SbF_6^-$, $AsF_6^-$, $GaF_6^-$, $(C_6F_5)_4B^-$, $CF_3SO_3^-$, $C_9F_{19}SO_3^-$ and $(CF_3SO_2)_3C^-$ or any other anion that is non-nucleophilic toward the resin and the active center of the polymerizing resin. Commercially available initiators, such as those sold under the trade names RHODORSIL® 2074 available from Rhodia, IRGACURE® 261 available from M.F. Cachat, AND CYRACURE® available from Dow, can be used for the practice of the invention. Again, any photosensitizer known to those skilled in the art can be used for the practice of the invention. In general photoinitiators and, if present, photosensitizers are less than 10 percent by weight of the resin and preferably are less than 5 percent of the resin, and most preferable 1 percent or less of the resin. Generally catalyst levels are in excess of 0.005 percent by weight.

Although in general the initiators for the radical and cationic embodiments of the invention are generally UV activated and require the use of a UV lamp, visible light initiators and sensitizers are known and can be used in an embodiment of the invention. In this case the light can be supplied by the LED or OLED itself rather than, or in addition to, an external lamp.

The size, position, and pattern of the microlenses can vary within the scope enabled by inkjet printing. Hence, lenses of a diameter of as little as about 10 μm to as large as about 500 μm can be formed on the OLED or LED substrate with spacing between lenses that can be as small as about 1 μm or less.

Figure 2:
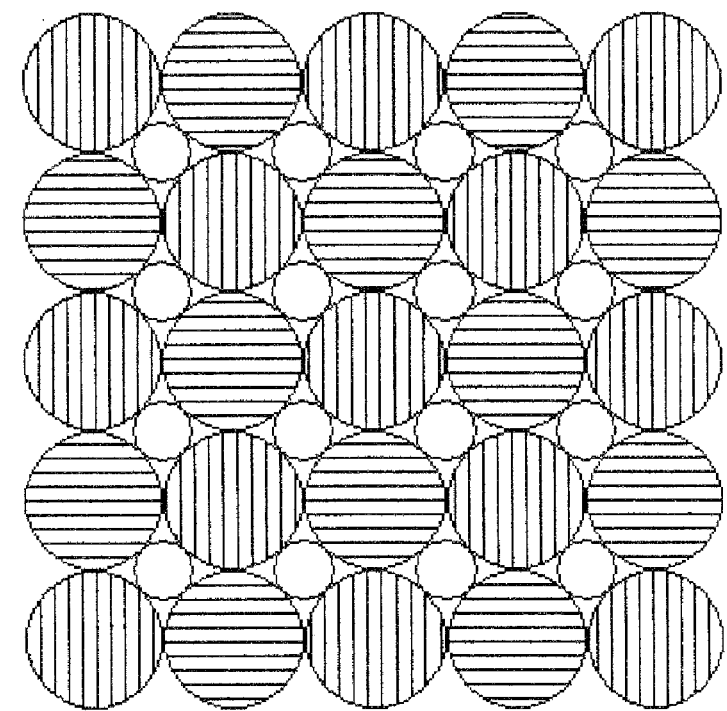
FIG. 2 shows the patterns of FIG. 1 where smaller microlenses are formed in the spaces between the larger lenses to increase the fraction of the surface covered by lenses.
Figure 2:
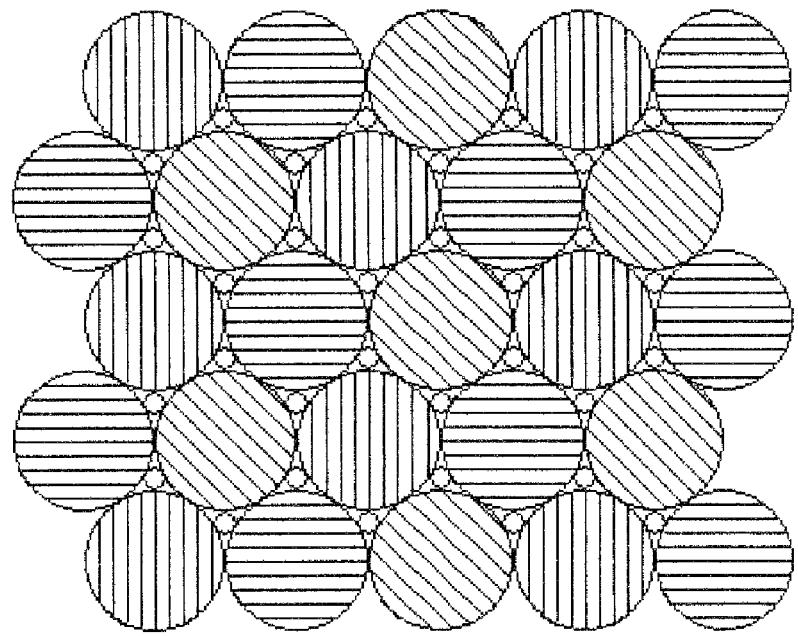
Figure 3:
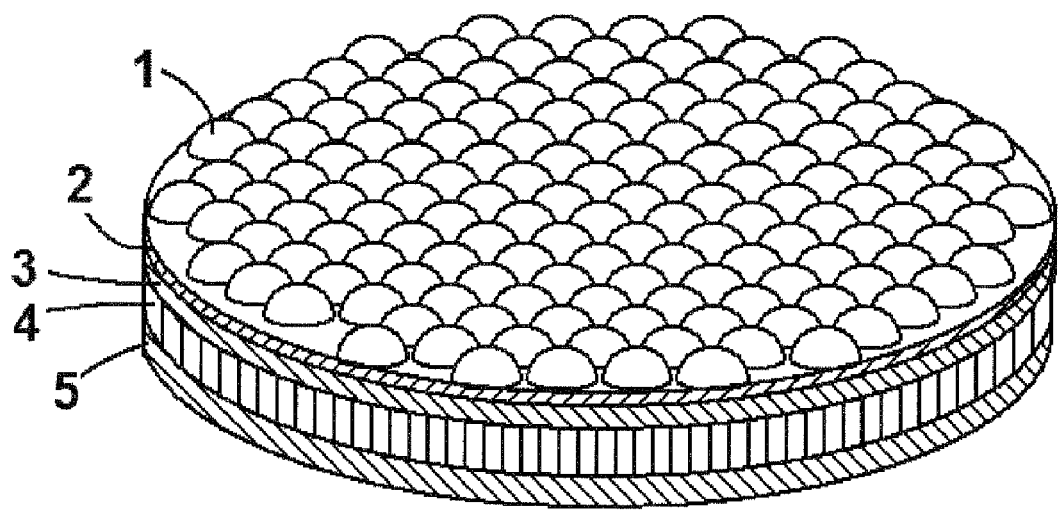
FIG. 3 shows a light emitting diode (10) having a cylindrical shape with a multiplicity of microlenses (1) having a contact angle of about 90 degrees attached to a coating (2) deposited on a transparent electrode layer (3), which is either a cathode or anode, situated on top of a light emitting layer (4) that separates electrode 3 from a counter electrode (5), which is either an anode or cathode, respectively, according to an embodiment of the invention.

A microlens array (MLA) can be inkjet printed by forming all microlenses in a single pass from a print head or the MLA can be formed by multiple passes where a portion of the microlenses in the MLA are formed during each pass. The multiple passes can be from a single print head or from multiple print heads. Where multiple passes are used, generally photocuring of the resin is carried out before second pass is carried out. By employing multiple passes, the spacing between lenses can be minimized which in the limit can be touching when the lens precursor material displays the proper viscosity such that the later deposited uncured resin does not flow around the microlenses present from an earlier pass. Four possible MLA patterns that can be achieved by multiple passes are illustrated in FIGS. 1 and 2. By using two multiple passes, MLAs can display parallel rows and columns of microlenses that are touching as shown in FIG. 2(a), where microlenses indicated with vertical cross hatching are formed in one pass and those with horizontal cross hatching are formed in a second pass. Using three passes, with microlenses formed from different passes indicated by different cross hatching, a hexagonally close packed structure can be formed, as shown in FIG. 1(b), where the center of lenses adjacent rows are offset by the radius of a microlens. Using multiple passes, an array that includes a plurality of lens radii can be used to more completely cover the surface with lenses. An exemplary highly covered surface is shown in FIG. 2(a) where parallel rows and columns of large microlenses have parallel rows and columns of smaller lenses (shown without hatching) partially filling the spaces between the larger lenses. Again, small microlenses can be formed in the spaces between larger hexagonally close packed larger microlenses as shown in FIG. 2(b). Patterns of microlenses in MLAs can vary and multiple sized lenses can be included in the arrays. Patterns need not be regular or periodic but can be irregular, quasiperiodic or random.

All patents, patent applications, provisional applications, and publications referred to or cited herein, supra or infra, are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. An light emitting device comprising:
   a cathode layer and an anode layer, wherein at least one of said cathode and anode layers is essentially transparent;
   at least one layer disposed between said cathode and anode wherein an electrical potential applied across said layer stimulates a light emission from said layer;
   a surface through which light is emitted;
   a coating on said surface; and
   at least one microlens attached to said coating, wherein said microlens comprises a material that displays a contact angle in excess of 40 degrees with said coating.

2. The device of claim 1, wherein said coating comprises the condensed residue of at least one silane coupling agent with functionality that provides said contact angle and the condensed residue of at least one other silane coupling agent containing a functionality which bonds to said microlens material.

3. The device of claim 1, wherein said coating comprises a siloxane polymer or copolymer comprising functionality that bonds to said surface, functionality that provides said contact angle, and functionality that bonds to said microlens material, and wherein said coating is less than about 100 nm in thickness.

4. The device of claim 1, wherein said microlenses are about 2 μm in diameter to about 500 μm in diameter.

5. The device of claim 1, wherein said microlenses display a contact angle of about 60 to about 90 degrees to said coating.

6. The device of claim 1, wherein said microlenses are derived from a photocurable resin.

7. A method to form microlenses on a surface comprising:
   providing a solid surface;
   coating said surface with a coating material, wherein said coating material comprises at least one first component for providing a large contact angle with a resin and at least one second component for copolymerizing with said resin;
   depositing said resin as one or more microdrops on said coating; and
   curing said resin; wherein said resin copolymerizes or otherwise reacts to form covalent bonds with at least some of said second component of said coating material to form microlens adhered to said surface.

8. The method of claim 7, wherein said surface is an exposed surface of a substrate comprising a LED or an OLED.

9. The method of claim 7, wherein said second component comprises about 0.1 to about 25 weight percent of said mixture.

10. The method of claim 7, wherein said step of coating comprises covering said surface with a mixture wherein said first component comprises one or more first silane coupling agents comprising at least one bonding structure for bonding to said surface and a large contact angle providing structure, and wherein said second component comprises one or more second silane coupling agents comprising said bonding structure and a polymerizable structure that copolymerizes with said resin.

11. The method of claim 7, wherein said step of coating comprises covering said surface with a siloxane copolymer with repeating units comprising a structure for bonding to said surface, repeating units comprising said first component, and repeating units comprising said second component.

12. The method of claim 7, wherein coating comprises dipping, spraying, rolling, brushing, vapor deposition, or spin coating.

13. The method of claim 7, wherein said step of depositing comprises inkjet printing.

14. The method of claim 7, wherein said resin comprises a radically polymerizable resin containing at least one radical photoinitiator and wherein said second component comprises a structure that can radically copolymerize with said resin.

15. The method of claim 14, wherein said resin further comprises a photosensitizer.

16. The method of claim 14, wherein said resin further comprises a chain transfer and/or chain terminating agent.

17. The method of claim 7, wherein said resin comprises a step-growth photoactivated addition polymerizable resin wherein said second component comprises a structure that can undergo addition with said resin.

18. The method of claim 7, wherein said resin comprises a cationically polymerizable resin containing at least one cationic photoinitiator and wherein said second component comprises a structure that can cationically copolymerize with said resin.

19. The method of claim 18, wherein said resin further comprises a sensitizer.

20. The method of claim 7, wherein the step of curing comprises irradiation from a radiation source external to an article having said surface.

21. The method of claim 7, wherein the step of curing comprises irradiation from a radiation source internal to an article having said surface.

22. The method of claim 7, wherein depositing comprises inkjet printing a plurality of microdrops wherein said microdrops form an array of said microlenses that are touching.

* * * * *

UNITED STATES PATENT AND TRADEMARK OFFICE
CERTIFICATE OF CORRECTION

PATENT NO.           : 8,040,058 B2
APPLICATION NO.      : 12/664909
DATED                : October 18, 2011
INVENTOR(S)          : Elliot P. Douglas and Jiangeng Xue Page 1 of 2

It is certified that error appears in the above-identified patent and that said Letters Patent is hereby corrected as shown below:

Title Page, Item (57), Abstract,
Line 7, "microlense to the coating" should read --microlens to the coating--.
Line 8, "microlense precursor" should read --microlens precursor--.
Line 13, "copolymeriable with" should read --copolymerizable with--.

In the Specifications:

Column 1,
Lines 12-15, "or drawings.

FIELD OF THE INVENTION"

should read

--This invention was made with government support under DD-EE0000990 awarded by Department of Energy. The government has certain rights in the invention.--.

Column 2,
Line 11, "foiing the" should read --forming the--.
Line 33, "spherical lenses" should read --spherical lens--.

Column 3,
Line 64, "the more a robust" should read --the more robust--.

Column 7,
Line 16, "can be an w" should read --can be an ω--.

Column 10,
Lines 17-18, "in an another" should read --in another--.

Signed and Sealed this
Thirteenth Day of March, 2012

David J. Kappos
*Director of the United States Patent and Trademark Office*

Column 11,
Lines 7-8, "$GaF_6^-$, $(C_6F_5)_4B^-$" should read --$GaF_6^-$, $BF_4^-$, $(C_6F_5)_4B^-$--.

UNITED STATES PATENT AND TRADEMARK OFFICE
CERTIFICATE OF CORRECTION

PATENT NO.         : 8,040,058 B2
APPLICATION NO.    : 12/664909
DATED              : October 18, 2011
INVENTOR(S)        : Elliot P. Douglas and Jiangeng Xue It is certified that error appears in the above-identified patent and that said Letters Patent is hereby corrected as shown below:

<u>Title Page, Item (57), Abstract,</u>
Line 7, "microlense to the coating" should read --microlens to the coating--.
Line 8, "microlense precursor" should read --microlens precursor--.
Line 13, "copolymeriable with" should read --copolymerizable with--.

<u>In the Specifications:</u>

<u>Column 1,</u>
Lines 12-15, "or drawings.

FIELD OF THE INVENTION"

should read

--or drawings.

This invention was made with government support under DD-EE0000990 awarded by Department of Energy. The government has certain rights in the invention.

FIELD OF THE INVENTION--.

<u>Column 2,</u>
Line 11, "foiing the" should read --forming the--.
Line 33, "spherical lenses" should read --spherical lens--.

This certificate supersedes the Certificate of Correction issued March 13, 2012.

Signed and Sealed this
Fifteenth Day of May, 2012

David J. Kappos
*Director of the United States Patent and Trademark Office*

Column 3,
Line 64, "the more a robust" should read --the more robust--.

Column 7,
Line 16, "can be an w" should read --can be an $\omega$--.

Column 10,
Lines 17-18, "in an another" should read --in another--.

Column 11,
Lines 7-8, "$GaF_6^-$, $(C_6F_5)_4B^-$" should read --$GaF_6^-$, $BF_4^-$, $(C_6F_5)_4B^-$--.